(12) United States Patent
Bittner et al.

(10) Patent No.: US 6,314,390 B1
(45) Date of Patent: Nov. 6, 2001

(54) METHOD OF DETERMINING MODEL PARAMETERS FOR A MOSFET COMPACT MODEL USING A STOCHASTIC SEARCH ALGORITHM

(75) Inventors: Calvin J. Bittner, Essex Junction; James P. Hoffmann, Colchester; Josef S. Watts, S. Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/201,206

(22) Filed: Nov. 30, 1998

(51) Int. Cl.[7] .............................. G06F 17/50; G06G 7/48
(52) U.S. Cl. ................................... 703/14; 703/4
(58) Field of Search ............................... 703/14, 4

(56) References Cited

U.S. PATENT DOCUMENTS 5,136,686  8/1992  Koza .
5,867,397 * 2/1999  Koza et al. ............................. 703/14

OTHER PUBLICATIONS

Meysenc et al.; "A high heat flux IGBT micro exchanger setup"; IEEE IAS '96; pp. 1309–1316, Oct. 1993.*
Frenzel; "Genetic Algorithms"; IEEE Potentials; pp. 21–24, Oct. 1993.*
Menozzi et al.; "Small–signal modeling for microwave FET linear circuits based on a Genetic Algorithm"; IEEE Trans. Cir. & Syst.; pp. 839–847, Oct. 1996.*
Yang et al.; "Genetic algorithm based parameter extraction of IC device model parameters"; IEEE CAS '98; pp. 375–378, Oct. 1998.*
Liu, Weidong; Jin, Xiadong; Chen, James; Jeng, Min–Chie; Liu, Zhihong; Cheng, Yuhua; Chen, Kai; Chan, Mansun; Hui, Kelvin; Huang, Jianhui; Tu, Robert; Ko, Ping K. and Hu, Chenming—*BSIM3V3.2 MOSFET Model User's Manual*, Department of Electrical Engineering and Computer Sciences, University of California, Berkeley, CA 94720, Copyright 1997–1998.

* cited by examiner

*Primary Examiner*—Mark R. Powell
*Assistant Examiner*—Hugh Jones
(74) *Attorney, Agent, or Firm*—DeLio & Peterson, LLC; Kelly M. Reynolds; H. Daniel Schnurmann

(57) ABSTRACT

A method of determining a set of parameters for modeling an active semiconductor device in which current flow through a channel or other area is regulated by voltage applied to the device terminals, for example, MOSFETs. The method comprises first providing a plurality of measured values for current as a function of voltage for a plurality of active semiconductor devices of differing geometries. There is then determined an initial population of vectors comprising individual values representing a plurality of desired active semiconductor device model parameters. Fitness is then evaluated for each of the vectors by comparing calculated values for current as a function of voltage from the population to the plurality of measured values for current as a function of voltage of the vectors, converting any current differences to voltage errors and adding any such voltage errors together to arrive at a fitness value for each vector. Vectors of best fitness are selected and at least one genetic operator is applied thereto to create a new population of the vectors. Vectors of best fitness are then selected. The steps of evaluating fitness and selecting vectors of best fitness are optionally repeated for such vectors of best fitness until a desired fitness is achieved to determine the desired active semiconductor device model parameters.

21 Claims, 7 Drawing Sheets

METHOD OF DETERMINING MODEL PARAMETERS FOR A MOSFET COMPACT MODEL USING A STOCHASTIC SEARCH ALGORITHM

BACKGROUND OF THE INVENTION

1. Field of the Invention

The present invention relates to semiconductor devices and, in particular, to a process employing a stochastic search algorithm to determine model parameters for MOSFETs.

2. Description of Related Art

In order to achieve increased performance metal oxide semiconductor field effect transistors (MOSFETs) at ever decreasing line width, for example, at one-quarter micron foundry technology now being used for manufacturing semiconductor devices, it is critical to employ accurate modeling while creating the initial designs of such MOSFETs. There are several commercial software packages available to solve the specific problem of semiconductor device modeling, for example, the UTMOST modeling software available from Silvaco Data Systems, Santa Clara, Calif. Additionally, proprietary software has also been developed by many companies to solve this problem. In all the known approaches, a great amount of human interaction is required in the fitting process.

The modeling software generally performs only a local optimization and, accordingly, may not find a global minimum unless reruns are made with several different initial guesses. Furthermore, the modeling software is not able to provide a measure of the fit of the overall model because of the wide range of magnitudes of currents in different regions of operation. Therefore, an operator must perform successive optimizations in different regions and iterate through the successive regions until overall convergence is obtained. Existing software does not evaluate reasonableness of values beyond the limits of the measured data until after fitting the data. If problems are found at that time, then additional iterations are required.

Although U.S. Pat. No. 5,136,686 teaches the application of genetic algorithms to model fitting, there is no disclosure or suggestion that it may be applied to the problem of fitting models for circuit simulation, particularly for modeling MOSFETs. Moreover, this patent defines the fitness function as the sum of the distances in the model range space between each pair of measured and simulated points. For semiconductor devices, the model output varies by many orders of magnitude such that only error regions of high output values contribute significantly to the sum. Other areas are not well modeled because the fitness function does not adequately reflect the fit in small valued regions.

Additionally, it has been found to be important that a fitness function also include a measure of the physical reasonableness of the model in regions where actual data cannot be measured, because the device will not operate there. Such constraints are important for models which will be used in complex computer simulations because violating them can lead to failure of the simulations to converge.

Bearing in mind the problems and deficiencies of the prior art, it is therefore an object of the present invention to provide an improved method of determining modeling parameters for MOSFETs.

It is another object of the present invention to provide a MOSFET modeling algorithm which may achieve both global and local optimization.

A further object of the invention is to provide a method of determining model parameters for MOSFETS which requires less human interaction is required in the fitting process.

It is yet another object of the present invention to provide a method of determining a set of parameters for modeling a MOSFET which provides a measure of the fit of the overall model over a wide range of magnitudes of currents in different regions of operation.

It is another object of the present invention to provide a method of calculating certain critical parameters which may limit the size of the search space.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of determining a set of parameters for modeling an active semiconductor device in which current flow through a channel or other area is regulated by voltage applied to the device terminals, for example, MOSFETs. The method comprises first providing a plurality of measured values for current as a function of voltage for a plurality of active semiconductor devices of differing geometries. There is then determined an initial population of vectors comprising individual values representing a plurality of desired active semiconductor device model parameters. Fitness is then evaluated for each of the vectors by comparing calculated values for current as a function of voltage from the population to the plurality of measured values for current as a function of voltage of the vectors, converting any current differences to voltage errors and adding any such voltage errors together to arrive at a fitness value for each vector. Vectors of best fitness are selected and at least one genetic operator is applied thereto to create a new population of the vectors. Vectors of best fitness are then selected. The steps of evaluating fitness and selecting vectors of best fitness are optionally repeated for such vectors of best fitness until a desired fitness is achieved to determine the desired active semiconductor device model parameters.

Preferably, the measured values for current as a function of voltage for a plurality of active semiconductor devices comprise values for drain current as a function of gate voltage, drain current as a function of drain voltage, and self gain.

In another aspect, the present invention provides a method of determining a set of parameters for modeling an active semiconductor device in which current flow through a channel or other area is regulated by voltage applied to the device terminals. A plurality of measured values for current as function of voltage are provided for a plurality of active semiconductor devices of differing geometries. An initial population of vectors comprising individual values representing a plurality of desired active semiconductor device model parameters is then determined. Values are calculated for a subset of parameters comprising fewer than all of the desired model parameters from each of the vectors. Fitness is evaluated for each of the vectors comparing vector individual values to the measured values using a fitness function. Vectors of best fitness are selected and at least one genetic operator is applied thereto to create a new population of the vectors. Diversity of the population of vectors is tested and optionally the parameter subset value calculation, fitness evaluation and best fitness vector selection are prepared until a sufficiently low vector population diversity is acheived.

Meta evolution parameters are added to each vector from the vectors having sufficiently low population diversity to control genetic operators and permit the rate and direction of change to evolve with each vector from generation to generation. At least one genetic operator is applied to the vectors having added meta evolution parameters to create a new population of the vectors. Values for the subset of parameters from each of the new population of vectors are calculated and fitness is evaluated for each of the vectors by comparing vector individual values to the measured values using a fitness function. Vectors of best fitness are selected and optionally the genetic operation, parameter subset value calculation and fitness evaluation are repeated for such vectors of best fitness until a desired fitness is achieved to determine the desired active semiconductor device model parameters.

Preferably, the measured values for current as a function of voltage for a plurality of active semiconductor devices comprise values for drain current as a function of gate voltage, drain current as a function of drain voltage, and self gain. Also, the subset of parameters is preferably selected from the group consisting of threshold voltage, mobility factor, subthreshold swing factor and offset voltage in the subthreshold region. It is also preferred that calculating the values for a subset of parameters from each of the vectors is done by applying a Newton-Raphson algorithm.

The preferred method of using the fitness function comprises assigning an error to calculated values for current as a function of voltage from the population as compared to the plurality of measured values for current as a function of voltage of the vectors by converting any current differences to voltage errors and adding any such voltage errors together. Genetic operators of crossover and mutation may be applied in the method.

In a further aspect, the present invention provides a program storage device readable by a machine, tangibly embodying a database for containing i) a plurality of measured values for current as a function of voltage for a plurality of active semiconductor devices of differing geometries in which current flow through a channel or other area is regulated by voltage applied to the device terminals and ii) an initial population of vectors comprising individual values representing a plurality of desired active semiconductor device model parameters. The device contains a program of instructions executable by the machine to perform the afore described method of determining a set of parameters for modeling an active semiconductor device.

In yet another aspect, the invention relates to a method of determining fitness of a vector comprising a set of parameters for modeling an active semiconductor device in which current flow through a channel or other area is regulated by voltage applied to the device terminals, for example, MOSFETs. The method comprises initially providing a plurality of measured values for current as a function of voltage for a plurality of active semiconductor devices of differing geometries, the measured values for current as a function of voltage for a plurality of active semiconductor devices comprising values for drain current as a function of gate voltage, drain current as a function of drain voltage, and self gain. An error is assigned to each current value calculated from the vector which differs from the measured values of drain current as a function of gate voltage and drain current as a function of drain voltage by converting any current differences to voltage errors. An error is also assigned to each self gain value calculated from the vectors which differs from the measured values of self gain by converting any self gain differences to voltage errors. A penalty is assigned based on drain conductance and transconductance model parameters and based on threshold voltage calculated from model parameters for a plurality of active semiconductor device channel width and length combinations. The errors and penalties are then combined to determine fitness for the vector.

In a related aspect, the present invention provides a program storage device readable by a machine, tangibly embodying a database for containing a plurality of measured values for current as a function of voltage for a plurality of active semiconductor devices of differing geometries, the measured values for current as a function of voltage for a plurality of active semiconductor devices comprising values for drain current as a function of gate voltage, drain current as a function of drain voltage, and self gain. The device further has a program of instructions executable by the machine to perform the afore described method of determining fitness of a vector comprising a set of parameters for modeling an active semiconductor device in which current flow through a channel or other area is regulated by voltage applied to the device terminals.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
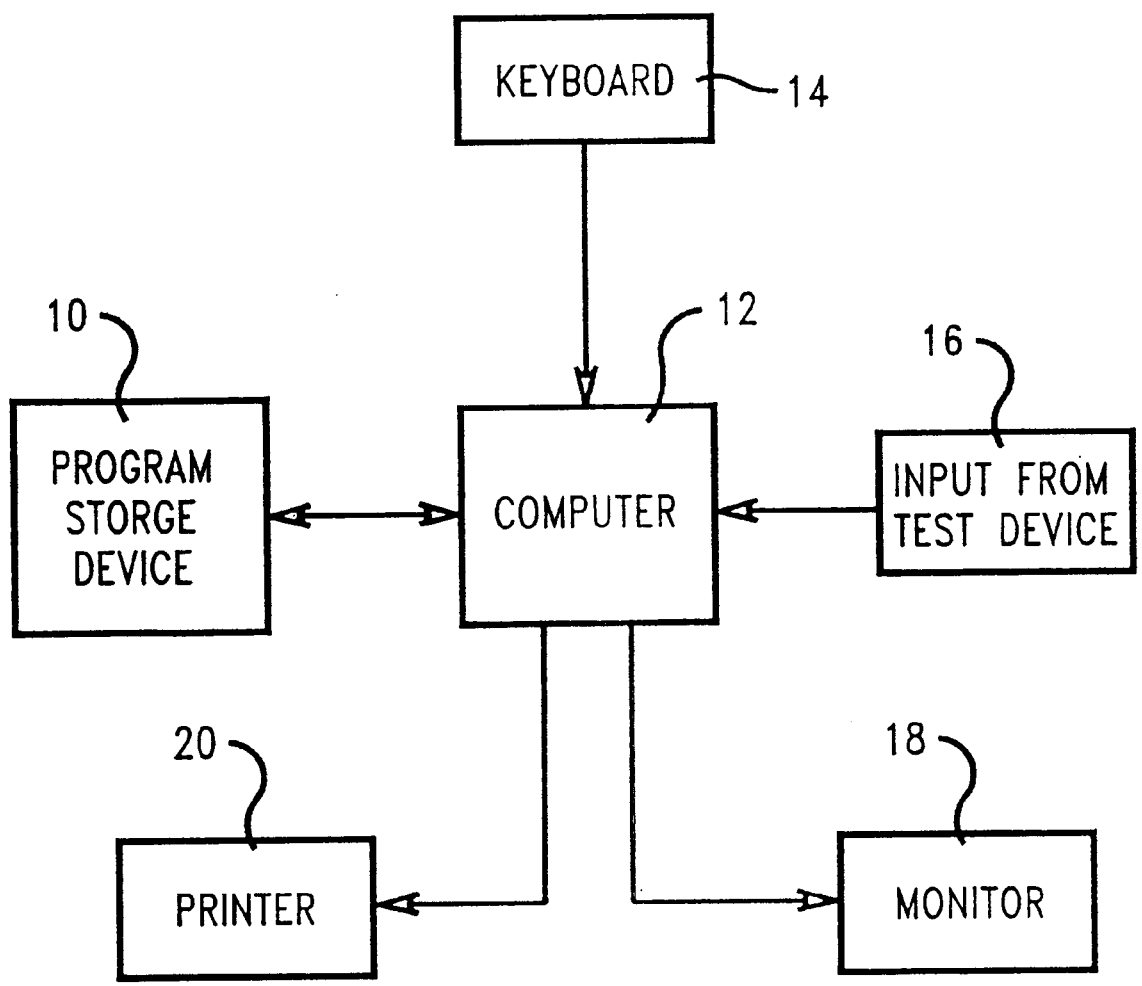
FIG. 1 is a schematic of a computer and associated program storage device on which the stochastic search algorithm of the present invention may be run.

In describing the preferred embodiment of the present invention, reference will be made herein to FIGS. 1–6 of the drawings in which like numerals refer to like features of the invention. Features of this invention are not necessarily shown to scale in the drawings.

The problem solved by the present invention is determining a set of parameters for a given MOSFET model to fit a given mathematical model to a given set of data while simultaneously satisfying constraints on the behavior of the model in regions where there is no data. Such parameters are shown and used in the BSIM3v3.2 MOSFET model developed by the Department of Electrical Engineering and Computer Sciences at the University of California at Berkeley and described in Lin et al., BSIM3v3.2 MOSFET Model Users Manual, 1997–98, The Regents of the University of California, the disclosure of which is hereby incorporated by reference. MOSFETs of differing geometries, i.e., differing channel lengths and widths, as well as other parameters, may be evaluated. The present invention may also be used to model parameters for other transistor and other active semiconductor devices in which current flow through a channel or other area is regulated by voltage applied to the device terminals, sometimes referred to as three terminal devices (bipolar) or, four or five terminal devices (MOSFETS).

In accordance with the present invention, measured hardware data is approximately reproduced and the following constraints are met: i) gm (gate transconductance) and gmbs (body transconductance) remain positive for all applied voltages less than three times the allowable applied voltage, ii) threshold voltage Vt is independent of channel length and width for all lengths and widths greater than a specified minimum and iii) the quantity Ids(L/W) (specific drain current) is similarly constant. The present invention utilizes a computer program which performs a stochastic search of the parameter vector space and finds a vector of parameters which satisfies the above criteria. The computer program or software incorporating the process steps and instructions described further below may be stored in a computer on an otherwise conventional program storage device, such as a semiconductor chip, a read-only memory, or magnetic media such as a diskette or computer hard drive, which is readable and executable by the computer.

The genetic algorithm utilized in the program of the present invention is based on a biological evolution paradigm in which small random changes are made. Those changes which lead to improvement are kept, and the accumulation of small improvements leads to a near optimum solution.

Definitions relevant to the present invention are as follows:

Vector—a string of numbers, each representing a value for a desired MOSFET model (e.g., BSIM3) parameter.

Individual—a vector representing a set of the MOSFET model fitting parameters.

Allele—a scaled value representing the numerical value of a MOSFET model parameter.

Population—a collection of individuals existing within the genetic algorithm.

Generation—one iteration of the genetic algorithm or the population at a particular iteration.

Patriarch—an individual provided by the user that represents an initial guess.

Mutation—the act of creating an individual from an existing individual by multiplying randomly selected alleles by (1+x) where x is a small random number.

Crossover—the act of creating an individual from two existing individuals by taking some alleles from each.

The program storage device used for the present invention contains a database which contains a plurality of measured values for current as a function for a plurality of MOSFETs or other active semiconductor devices of differing geometries, e.g., channel length and width. The database in the program storage device also contains an initial population of vectors comprising individual values representing a plurality of desired parameters for MOSFETs or other active semiconductor devices. Such a program storage device 10 is shown in FIG. 1 in communication with computer 12. Information as to measured test values is input by keyboard 14 or directly from test devices 16 for storage in a database in device 10. Information as to the initial population of vectors representing the desired parameters is also input by keyboard 14. The program which performs the method of the present invention is also stored in device 10. Upon execution of the algorithm, output of the final results of the desired model parameters is made to monitor 18 or printer 20.

The preferred program uses an algorithm in which a population is created by mutation of a patriarch, each individual is evaluated for fitness, and a new population is created by mutation and crossover applied to the fittest individuals. The process continues looping through these steps until a fixed number of generations has been evaluated. The process uses a stochastic or random search which is able to escape from local minimums, can optimize for a complex fitness function, and can incorporate convergence constraints while fitting.

The basic algorithm of the present invention begins with an initial guess for the values of the desired model parameters, expressed as an initial population of vectors. The algorithm then evaluates the fitness of each individual or vector of the desired parameters, selects the vectors of highest fitness, and optionally applies genetic operators such as mutation an/or crossover to create a new population of vectors which are then evaluated for fitness and selected as described previously. The preferred fitness function utilized with the basic algorithm converts the current errors $\Delta I$ between current data points measured by the initial tests and current data points predicted by the vectors of model parameters into voltage errors $\Delta V$. This is done by dividing the current by the gradient of current/voltage in order to obtain a common scale for differences from device-to-device. The voltage errors are then added in order to determine the relative fitness of the various vectors being compared. Penalties and other factors may also be assessed in the preferred fitness function, as will be discussed in more detail below.

Figure 2:
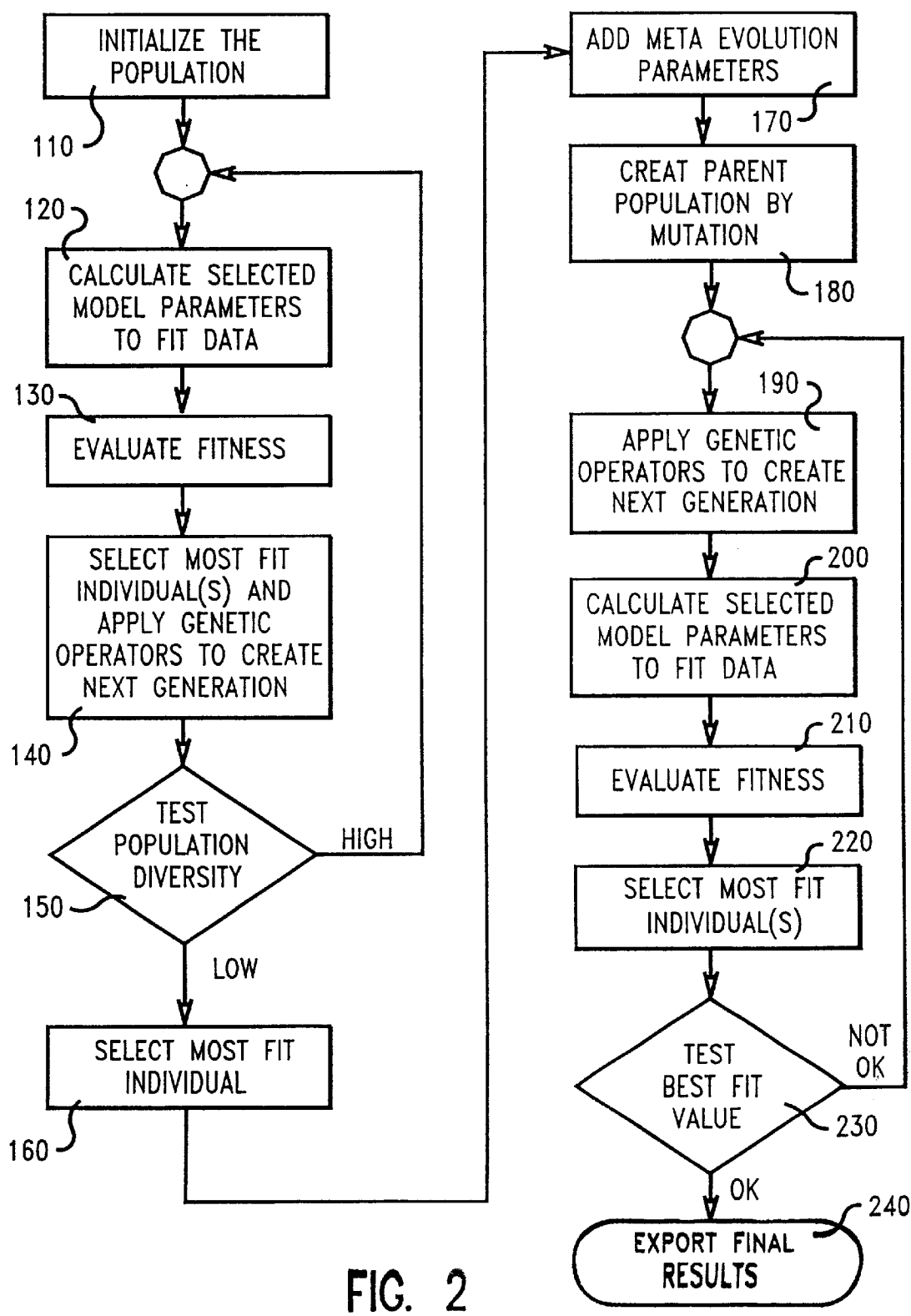
FIG. 2 is a flow diagram of the operation of the preferred stochastic search algorithm of the present invention.

More preferably, as shown in FIG. 2, an initial population of vectors is created in step 110, which algorithm parameter values are constrained to within physically reasonable bounds. Next, in step 120, for each individual vector, a small group of key parameters is calculated deterministically from the vector of stochastically assigned parameters in such a way that the fit to the data is optimized. The fitness of each vector is evaluated in step 130, and the most fit individuals are selected and genetic operations of mutation and crossover are applied in step 140 to create a new population. Diversity or the convergence velocity of the populations is tested in step 150 and, if it is too high, aforementioned steps of key parameter calculation, fitness evaluation and selection, and genetic operation are optionally repeated. If diversity or convergence velocity is sufficiently low, the process continues from the initial broad based search to a more focused search.

In the more focused search, meta evolution parameters are added to each vector in step 170. These parameters control the genetic operators and allow the rate and direction of change from generation to generation to evolve along with the model parameters vector. A new parent population of vectors is created by applying the genetic operation of mutation and/or crossover in step 180 or 190. Subsequently, in step 200, for each individual vector a small group of key parameters is again calculated deterministically from the vector stochastically assigned parameter in such a way that the fit to the data is optimized. The fitness of each vector is evaluated in step 210, and the most fit individuals are selected in step 220. The value of the fitness function is then tested in step 230 and the steps of genetic operations of mutation and crossover to create a new population, key parameter calculation, and fitness determination and selection are optionally repeated until the desired final model parameters are obtained and exported in step 240.

The preferred genetic operations of mutation and crossover performed on the vectors are well known, and are described in the aforementioned U.S. Pat. No. 5,136,686, the disclosure of which is incorporated herein by reference. Although any well-known fitness function may be used with the preferred algorithm of the present invention, the aforementioned fitness function which converts current errors to voltage errors among the data points is preferred.

EXAMPLE

Initial Lab Measurements

A set of 10–16 individual MOSFETs were processed on the same die with different channel lengths and widths and selected for measurement. These MOSFETs of differing geometries were selected to include a device long and wide enough so that short channel and narrow channel effects are negligible, a series of devices of this same length but decreasing widths down to the minimum width allowed by the technology ground rules, a series of devices of this same width but decreasing lengths down to the minimum length allowed by the technology ground rules, and one of more devices that exhibit a combination of short and narrow channel effects.

Three sets of device current measurements were made. All measured data, except those below measurement capability of the instruments, were kept for model verification. In order to reduce the run time of the fitting program, only a subset of the measured data is used for fitting.

Figure 3A:
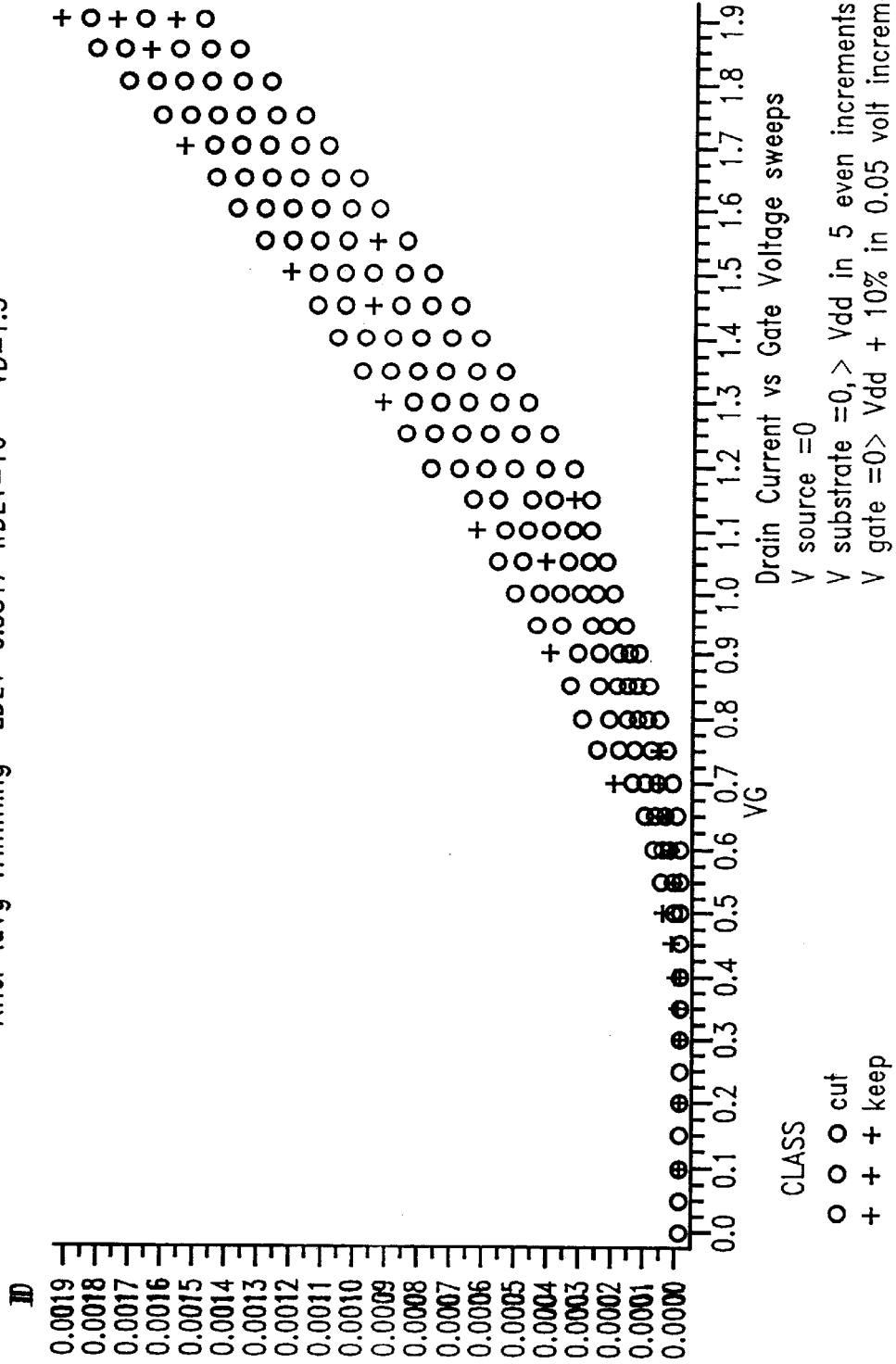
FIG. 3a is a linear scale plot of data points for drain current versus gate voltage for different geometries of MOSFET devices used for comparison in an example of the stochastic search algorithm of the present invention.
Figure 3B:
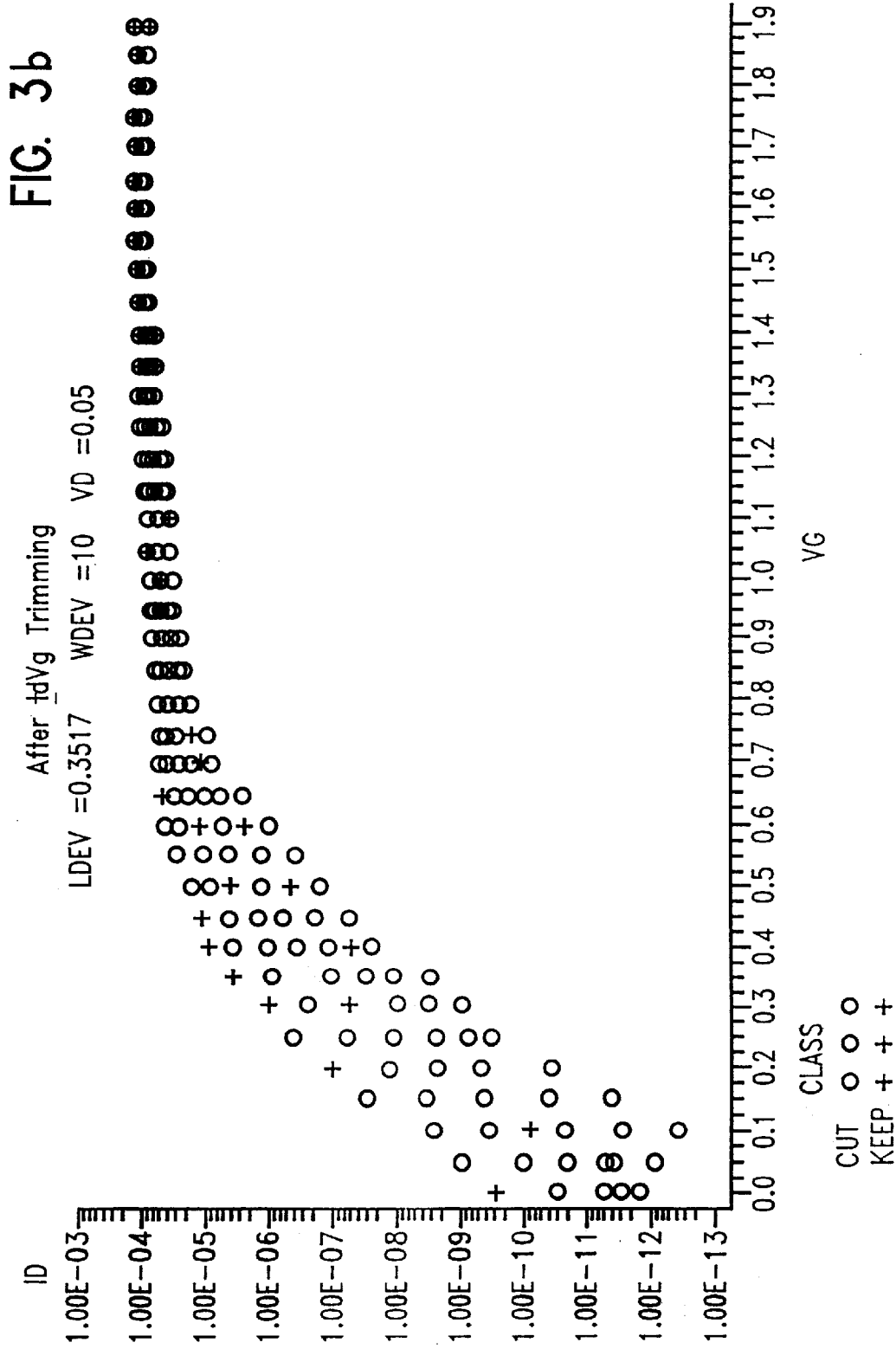
FIG. 3b is a plot of the data points of FIG. 3a, but in a logarithmic scale.

In the first set, drain current Id as a function of gate voltage Vg sweeps was measured, as shown in FIG. 3a on a linear scale and in FIG. 3b on a logarithmic scale. The source voltage Vsource and substrate voltage Vsubstrate were set at zero, the voltage on the MOSFET drain Vdrain was set at 0.05 volts and the gate voltage Vgate was moved or swept from a value of zero to a value of ten percent over the maximum design voltage Vdd in 0.05 volt increments. The substrate voltage Vsubstrate was then decreased to a negative value and the gate voltage was again swept over the range. This sweeping with lower substrate voltages was repeated to obtain 5–6 sets of data points.

This drain current versus gate voltage sweep data was then processed to reduce the number of data points. Low gate voltage points with drain current near or below the sensitivity of the measurement were removed. Gate voltage data points below the gate voltage threshold Vt (subthreshold data points) were removed leaving two to three widely spaced points per sweep in the log linear part of the curve (FIG. 3b). All points just below and above the threshold were retained. Points above the gate voltage threshold were removed leaving points spaced 0.2 to 0.3 volts apart on each curve. The second, fourth and sixth Vsubstrate sweep at each Vdrain condition was also eliminated. The data points which were removed are shown in FIGS. 3a and 3b as 0, and the data points retained are shown as +.

Figure 4:
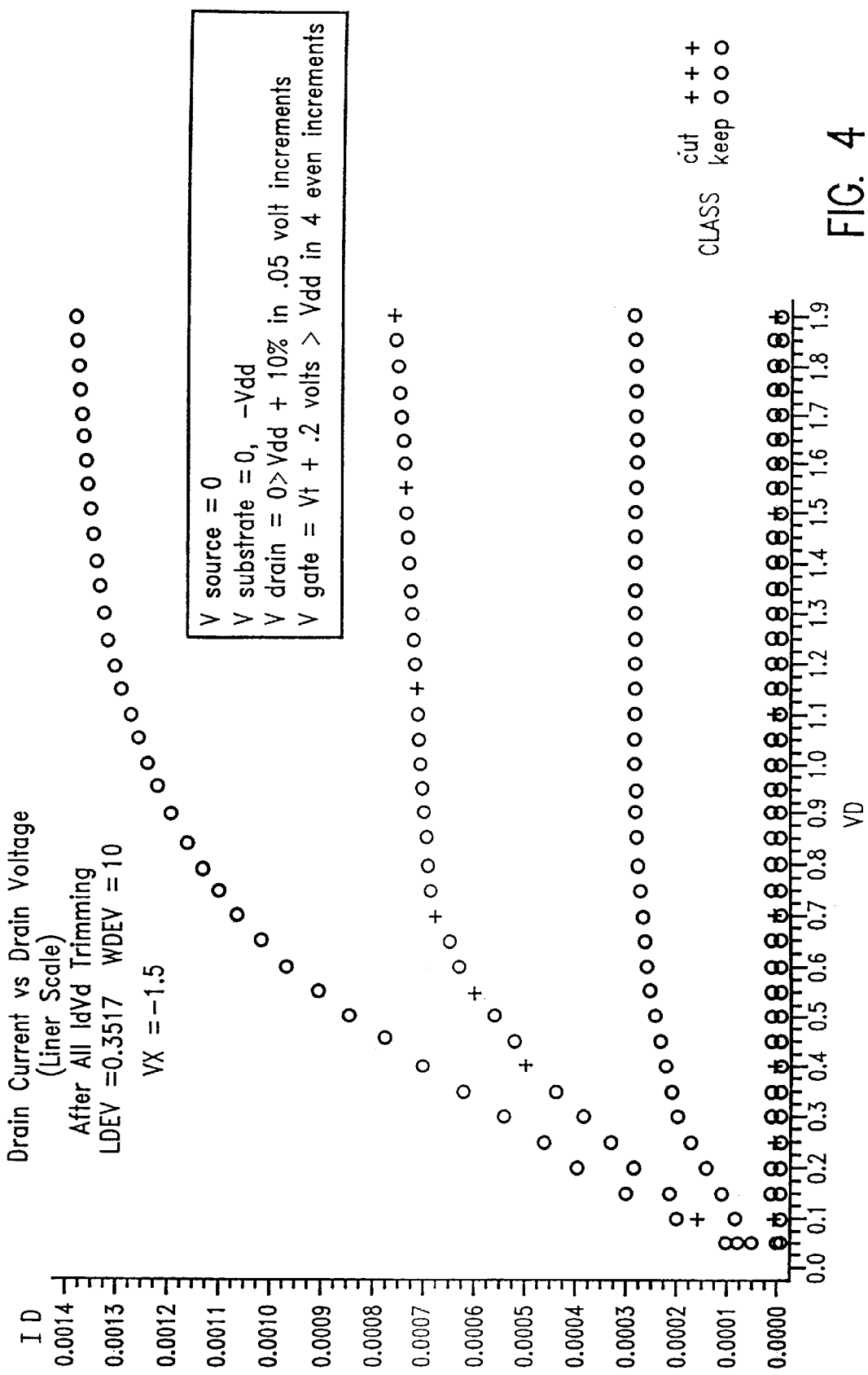
FIG. 4 is a linear scale plot of data points for drain current versus drain voltage for different geometries of MOSFET devices used for comparison in an example of the stochastic search algorithm of the present invention.

In the second set of device current measurements, drain current Id versus drain voltage Vd was measured, as shown in FIG. 4. The source voltage Vsource and substrate voltage Vsubstrate were set at zero, the gate voltage was set at a value of threshold voltage Vt plus 0.2 volts and the voltage on the MOSFET drain Vdrain was moved or swept from a value of zero to a value of ten percent over the maximum design voltage Vdd in 0.05 volt increments. The gate voltage Vgate was then increased to a higher value and the drain voltage was again swept over the range. This sweeping with higher gate voltages was repeated to obtain 4–5 sets of data points.

This data was processed to reduce the number of data points. Points were removed from the linear region leaving points 0.2 to 0.3 volts apart on each curve. All points were kept near the transition from linear to saturated operation. Points were removed from the saturation region leaving 0.3 to 0.4 volts apart on each curve. The data points which were removed are shown in FIG. 4 as 0, and the data points retained are shown as +.

Figure 5:
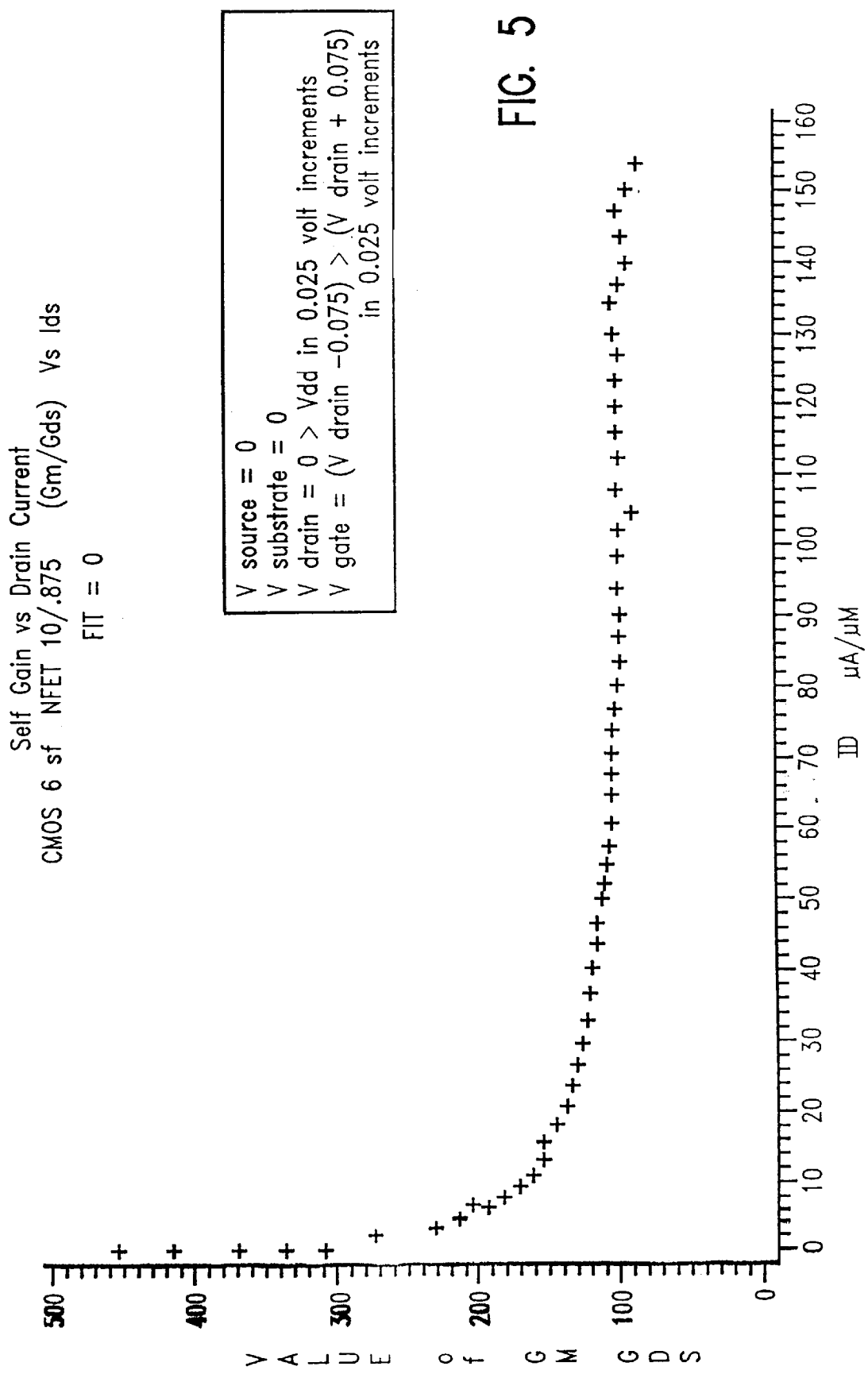
FIG. 5 is a linear scale plot of data points for self gain versus drain current for different geometries of MOSFET devices used for comparison in an example of the stochastic search algorithm of the present invention.

The third set of device current measurements were of self gain as a function of drain current, as shown in FIG. 5. The source voltage Vsource and substrate voltage Vsubstrate were set at zero, drain voltage Vdrain was set at zero volts, and gate voltage Vgate was swept from a value of Vdrain +0.075 volts to a value of Vdrain −0.075 volts in 0.025 volt increments. Vdrain was then increased by 0.025 volts and the Vgate sweep was repeated. The process was repeated for increasing Vdrain increments of 0.025 volts. For each point on the self gain data at which Vdrain = Vgate, the drain conductance (dId/dVds) and transconductance (dId/dVgs) were estimated numerically from the self gain data and the self gain value was calculated as the ratio (gm/gds), where gate transconductance is gm and drain conductance is gds.

This data was processed to reduce the data volume by removing the subthreshold region. Points were removed from the portion of the curve with drain current above 5 microamps per micrometer of channel width to leave points spaced about 1 microamp/micrometer apart.

Stochastic Fitting Algorithm

The above data is input to a computer program which executes the preferred stochastic fitting algorithm of the present invention. The MOSFET model parameters from the BSIM3 model that were fit in accordance with the present invention are shown in Table 1 below. The first column lists the parameter symbol, which is further defined in Table 2. The second column of Table 1 identified as "Fitting" uses the term "Full" to indicate that the parameter will be fit when all geometries are fitted, "Calculated" when the parameter will be calculated for each individual based on evolving parameters, and "Lab" when inputs will be measured in lab tests before using the program. The third column "Regions Affected" identifies the regions of operation on the current versus voltage plot which the parameter affects. Those affecting threshold voltage Vt indirectly affect all other regions. The next column identified as "strong Interaction" groups the parameters that strongly affect each other. The next column "Scaling" identifies the variation the parameter is describing, i.e., length (L), width (W), drain to source voltage (Vds), gate to source voltage (Vgs), and body to source voltage (Vbs). Blanks identify overall parameters that shift the current versus voltage curve up and down. The last column, marked "Precision" identifies the precision needed in representing the parameter.

TABLE 1

BSIM3 Fitting

| Parameter Symbols | Fitting | Regions Affected | | | | | Parameters | | |
| --- | --- | --- | --- | --- | --- | --- | --- | --- | --- |
| | | Vt | Sub threshold | Linear | Saturated | Strong Interaction | Scaling | Range (restrict to +/- % of initial guess) | Precision |
| cdsc | Full | | X | | | | Length | (-5e-4-5e-3) | 1e-4 |
| cdscb | First | | X | | | | Length, Vbs | (-5e-4-5e-3) | 1e-4 |
| cdscd | First | | X | | | | Length, Vds | (-5e-4-5e-3) | 1e-4 |
| nfactor | Calculated | | X | | | | Vgs | 0-2 | .001 |
| xj | Full | | | X | X | | Length | 3e-8-5e-7 | 1e-8 |
| keta | First | | | X | X | | Vbs | -.1-0 | .01 |
| npeak(nch) | Full | X | | X | X | | Length | 1e16-1e19 | 1% \| o |
| aO | Full | | | X | X | | Length | .75-2 | .001 |
| ags | First | | | X | X | | Length, Vgs | 0-10 (50%) | .001 |
| k1 | First | X | | X | X | | Vbs | 0-2 (20%) | .001 |
| K2 | First | X | | | | | Vbs | -.05-.05 | .001 |
| K3 | Full | X | | | | | Width | -100-100 | 1 |
| K3b | Full | X | | | | | Width, Vbs | -10-10 | 1 |
| w0 | Full | X | | | | | Width | 0-2e-6 | 1e-8 |
| n1x | Full | X | | | | | Length | 1e-8-1e-6 | 1e-9 |
| dvt0 | Full | X | | | | | Length | 0-10 (+100/-50%) | .001 |
| dvt1 | Full | X | X | | | | Length | 0-1 (50%) | .001 |
| dvt2 | Full | X | | | | | Length, Vbs | -5 - 0 | .01 |
| dvt0w | Full | X | | | | | L * W | 0-10 | .01 |
| dvt1w | Full | X | | | | | L * W | 0-1 | .01 |
| dvt2w | Full | X | | | | | L * W, Vbs | -.5-0 | .01 |
| Drout | Full | | | | X | | Length | .01-.2 | .001 |
| Dsub | Full | | X | | | | Length, Vds | .01-.2 (50%) | .001 |
| vth0 | Calculate | X | | | | | | .2-.8 (+ for NFET - for PFET) | .001 |
| ua | First | | | X | X | | Vgs | 5e-11-1e-8 (50%) | 1e-11 |
| ub | First | | | X | X | | Vgs | 1e-21-1e-18 | 1e-21 |
| uc | First | | | X | X | | | -1e-8 +1e-9 | 1e-11 |
| u0 | Calculated | | | X | X | | | Input value +/-30% expect: 300-700 NFET 50-150 PFET | .1 |
| voff | Calculated | | X | | | | Vgs | -.15-.15 | .0001 |
| delta | First | | | X | X | | Vds | .001-.03 | .0001 |
| rdsw | First | | | X | X | | Vgs | 50-200 NFET (50%) 150-500 PFET (50%) | 1 |
| prwg | First | | | X | X | | Vgs | -1e-3-1e-3 | 1e-5 |
| prwb | First | | | X | X | | Vbs | -1e-3-1e-3 | 1e-5 |
| eta0 | First | X | | | | | Vds | 0-1 (50%) | .001 |
| etab | First | X | | | | | Vds*Vbs | -.1-0 | .001 |
| pclm | First | | | | X | | Length, Vgs | 0-1 | .001 |
| pdibl1 | First | | | | X | | Length, Vds | 0-1 | .001 |
| pdibl2 | Full | | | | X | | Vds | -.01-.01 | .0001 |
| pdiblb | First | | | | X | | Vds, Vbs | -1-0 | .001 |
| pscbe1 | First | | | | X | | Length, Vds | 1e8-1e10 | logrith |
| pscb2 | First | | | | X | | Length, Vds | 0-1e-5 | 1e-8 |
| Vsat | First | | | X | X | | Vds, Vgs | 1e4-1e6 | 5%, 1 |
| pvag | First | | | | X | | Vgs | 0-10 | .01 |
| dwg | Full | | | X | X | | Vgs | -1e-7-1e-7 | 1e-10 |
| dwb | Full | | | X | X | | Vbs | -1e-7-1e-7 | 1e-10 |
| b0 | Full | | | X | X | | Width | -1e-5-1e-5 | 1e-8 |
| b1 | Full | | | | X | | Width | 0-1e-6 | 1e-8 |
| lrdsw | Full | | | X | X | | Length | 0-50 | .1 |

TABLE 1-continued

BSIM3 Fitting

| Parameter Symbols | Fitting | Regions Affected | | | | Parameters | | |
|---|---|---|---|---|---|---|---|---|
| | | Vt | Sub threshold | Linear | Saturated | Strong Interaction | Scaling | Range (restrict to +/– % of initial guess) | Precision |
| pua | Full | | | X | X | | L * W | -1e-10-1e-10 | 1e-12 |
| puc | Full | | | X | X | | L * W | -1e-10-1e-10 | 1e-12 |
| pu0 | Full | | | X | X | | L * W | -10-10 | .01 |
| ww | Full | | | X | X | | Width | -1e-8-1e-8 | 1e-11 |
| w1 | Full | | | X | X | | Length | -1e-8-1e-8 | 1e-11 |
| tox | Lab | X | X | X | X | | | 5-10e-9 | 1e-11 |
| ngate | Lab | X | X | X | X | | | 1e16-6e21 | 1% |
| ljnt | Lab | X | X | X | X | | | 0-2e-7 | 1e-9 |
| wint | Lab | X | X | X | X | | | -2e-7-2e-7 | 1e-9 |

213-TAB1

TABLE 2

| Parameter | Definition |
|---|---|
| cdsc | Drain/source to channel coupling capacitance |
| cdscb | Body - bias sensitivity of cdsc |
| cdscd | Drain bias sensitivity of cdsc |
| xj | |
| a1 | First non-saturation effect parameter |
| a2 | Second non-saturation factor |
| keta | Body bias coefficient of bulk charge effect |
| Npeak (nch) | Channel doping concentration |
| a0 | Bulk charge effect coefficient for channel length |
| ags | Gate bias coefficient of Abulk |
| k1 | First order body effect coefficient |
| K2 | Second order body effect coefficient |
| K3b | Body effect coefficient of k3 |
| w0 | Narrow width parameter |
| nix | Lateral non-uniform duping parameter |
| dvt0 | First coefficient of short channel effect on Vth |
| dvt1 | Second coefficient of short channel effect on Vth |
| dvt2 | Body bias coefficient of short channel effect on Vth |
| dvt0 | First coefficient of narrow width effect on Vth for small channel length |
| dvt1 | Second coefficient of short channel effect on Vth |
| dvt0w | First coefficient of narrow width effect on Vth for small channel effect |
| dvt1w | Second coefficient of narrow width effect on Vth |
| dvt2w | Body bias coefficient for small channel length |
| Drout | L dependence coefficient of the DIBL correction parameter in Rout |
| Dsub | DIBL coefficient exponent in subthreshold region |
| vth0 | Threshold voltage |
| ua | First order mobility degradation coefficient |
| ub | Second order mobility degradation coefficient |
| uc | Body effect of mobility degradation coefficient |
| u0 | Mobility at temp = Tnormal |
| Voff | Offset voltage in the subthreshold region for large Ward L |
| delta | |
| rdsw | Parasitic resistance per unit width |
| prwg | Gate bias effect coefficient of rdsw |
| prwb | Body effect coefficient of rdsw |
| eta0 | DIBL coefficient in subthreshold region |
| etab | Body biascoefficient for the subthreshold DIBL effect |
| pclm | |
| pdibl1 | First output resistance DIBL effect correction parameter |
| pdibl2 | Second output resistance DIBL effect correction parameter |
| pdibib | Body effect coefficient of DIBL correction parameters |
| pscbe1 | First substrate current body effect parameter |
| pscb2 | Second substrate current body effect parameter |
| Vsat | Saturation velocity at temp = Tnom |
| pvag | Gate dependence of early voltage |
| dwg | |
| dwb | |

TABLE 2-continued

| Parameter | Definition |
|---|---|
| b0 | Bulk charge effect coefficient for channel width |
| b1 | Bulk charge effect width offset |
| lrdsw | |
| pua | |
| puc | |
| puo | |
| ww | Coefficient of width dependence for width effect |
| wl | coefficient of length dependence for width effect |
| tox | Gate oxide thickness |
| ngate | Poly-gate doping concentration |
| lint | Length effect fitting parameter-from I-V without bias |
| wint | Width offset fitting parameter-from I-V without bias |

Create Initial Population of Vectors

An initial population of vectors was created from an initial estimate or guess of each of the aforementioned parameters to be fitted. Each vector comprised a string of numbers, with one number or value for each of the parameters in Table 1. It is important that throughout the algorithm, parameter values are constrained to within physically reasonable bounds. The initial guess may be determined by generating a vector from an existing fitted model for similar technology, such as the PGA or BSIM3 model, and a rough fitting of base Vt, mobility and subthreshold slope. An alternative method of randomly assigning a value from the range of valid values to each parameter for each member of the population has been found to work about equally well, although it will generally not converge as quickly in the subsequent steps of the algorithm. The population of a plurality of vectors is created by making copies of the initial guess and for each one randomly varying a few of the individual parameters.

Calculate Selected Subset of Parameters

For each individual vector, a small group or subset of key parameters then was calculated deterministically from the vector of stochastically assigned parameter in such a way that the fit to the data is optimized. For the BSIM3 model employed the parameters thus modeled were base threshold voltage Vth0, mobility factor at nominal temperature u0, subthreshold swing factor nfactor, and offset voltage in subthreshold region Voff. The new values of Vth0 and u0 were calculated simultaneously using two iteration of the Newton-Raphson algorithm, and nfactor and Voff were calculated together in the same fashion.

The Newton-Raphson algorithm is a well known iteration method for solving equations f(x)=0, where f is assumed to have a continuous derivative f'. This algorithm computes a solution of f(x)=0 given an initial approximation $x_0$, the starting value of the iteration, tolerance $\epsilon > 0$, with a maximum number of iterations of N. The output is the approximate solution $x_n$ ($n \leq N$) or message of failure. The algorithm is described as follows in Table 3:

TABLE 3

For n = 0, 1, 2, . . . , N-1 do:
  (1) Compute f' ($x_n$)
  (2) If f' ($x_n$) = 0, then OUTPUT "Failure". Stop
  (3) Else compute $x_{n+1} = x_n - (f(x_n)/f'(x_n))$
  (4) If $x_{n+1} - x_n \leq \epsilon$ then OUTPUT $x_{n+1}$. Stop. (Procedure completed successfully)
End
  (5) OUTPUT "Failure". Stop (Procedure completed unsuccessfully after N iterations)

3. The fitness of each vector is evaluated. The fitness function is detailed below.

Evaluate By Fitness Function

The fitness of each individual is calculated as the sum of the following parts representing different requirements of good model quality. A smaller value represents a more fit individual.

Initially, the vector parameter values are plugged into the model equations being utilized to generate a drain current versus gate voltage plot and a drain current versus drain voltage plot. The model equations utilized in this experiment were those of the aforementioned BSIM3 model, although any other suitable model equations may be substituted. For the BSIM3 model, the equations used were the I-V model as shown in Tables 4 through 14 as follows:

TABLE 4

Threshold Voltage Equations $$V_{th} = V_{th0ox} + K_{tox} \cdot \sqrt{\Phi_s - V_{bseff}} - K_{2ox} V_{bseff} + K_{1ox}\left(\sqrt{1 + \frac{Nlx}{L_{eff}}} - 1\right)\sqrt{\Phi_s} + (K_3 + K_{3b}V_{bseff})\frac{T_{ox}}{W'_{eff} + W_0}\Phi_s -$$

$$D_{VT0w}\left(\exp\left(-D_{VT1w}\frac{W_{eff}L_{eff}}{2l_{tw}}\right) + 2\exp\left(-D_{VT1w}\frac{W_{eff}L_{eff}}{l_{tw}}\right)\right)(V_{bi} - \Phi_s) - D_{VT0}\left(\exp\left(-D_{VT1}\frac{L_{eff}}{2l_1}\right) + 2\exp\left(-D_{VT1}\frac{L_{eff}}{l_1}\right)\right)(V_{bi} - \Phi_s) -$$

$$\left(\exp\left(-D_{sub}\frac{L_{eff}}{2l_{to}}\right) + 2\exp\left(-D_{sub}\frac{L_{eff}}{l_{to}}\right)\right)(E_{too} + E_{lab}V_{bseff})V_{ds}$$

$$V_{th0ox} = V_{th0} - K_1 \cdot \sqrt{\Phi_s}$$

TABLE 4-continued

Threshold Voltage Equations $$K_{1ox} = K_1 \cdot \frac{T_{ox}}{T_{oxm}}$$

$$K_{2ox} = K_2 \cdot \frac{T_{ox}}{T_{oxm}}$$

$$l_t = \sqrt{\varepsilon_{si} X_{dep}/C_{ox}} \, (1 + D_{VT2} V_{bseff})$$

$$l_{tw} = \sqrt{\varepsilon_{si} X_{dep}/C_{ox}} \, (1 + D_{VT2w} V_{bseff})$$

$$l_{t0} = \sqrt{\varepsilon_{si} X_{dep0}/C_{ox}}$$

$$X_{dep} = \sqrt{\frac{2\varepsilon_{si}(\Phi_s - V_{bseff})}{qN_{ch}}}$$

$$X_{dep0} = \sqrt{\frac{2\varepsilon_{si}\Phi_s}{qN_{ch}}}$$

$$V_{bseff} = V_{bc} + 0.5\left[V_{bs} - V_{bc} - \delta_1 + \sqrt{(V_{bs} - V_{bc} - \delta_1)^2 - 4\delta_1 V_{bc}}\right]^{(\delta 1 = 0.001)}$$

$$V_{bc} = 0.9\left(\Phi_s - \frac{K_1^2}{4K_2^2}\right)$$

$$V_{bi} = v_t \ln\left(\frac{N_{ch} N_{DS}}{ni^2}\right)$$

TABLE 5

Effective ($V_{gs}$ - $V_{th}$) Equations $$V_{gsteff} = \frac{2nv_t \ln\left[1 + \exp\left(\frac{v_{gs} - v_{th}}{2nv_t}\right)\right]}{1 + 2nCox\sqrt{\frac{2\Phi_s}{q\varepsilon_{si} N_{ch}}} \exp\left(-\frac{V_{gs} - V_{th} - 2_{off}}{2nv_t}\right)}$$

$$n = 1 + N_{factor}\frac{C_d}{C_{ox}} + \frac{(C_{dsc} + C_{dscd}V_{th} + C_{dscb}V_{bseff})\left(\exp\left(-D_{VT1}\frac{L_{eff}}{2l_t}\right) + 2\exp\left(-D_{VT}\frac{L_{eff}}{l_t}\right)\right) + \frac{C_{it}}{C_{ox}}}{Cox}$$

$$C_d = \frac{\varepsilon_{si}}{X_{dep}}$$

TABLE 6

Mobility Equations

For mobMod = 1

$$\mu_{eff} = \frac{\mu_o}{1 + (U_a + U_c V_{bseff})\left(\frac{V_{gsteff} + 2V_{th}}{Tox}\right) + U_b\left(\frac{V_{gsteff} + 2V_{th}}{Tox}\right)^2}$$

For mobMod = 2

$$\mu_{eff} = \frac{\mu_o}{1 + \left(U_a + U_c V_{bseff}\right)\left(\frac{V_{gsteff}}{Tox}\right) + U_b\left(\frac{V_{gsteff}}{Tox}\right)^2}$$

For mobMod = 3

$$\mu_{eff} = \frac{\mu_o}{1 + \left[U_a\left(\frac{V_{gsteff} + 2V_{th}}{Tox}\right) + U_b\left(\frac{V_{gsteff} + 2V_{th}}{Tox}\right)^2\right](1 + U_c V_{bseff})}$$

TABLE 7

Drain Saturation Voltage Equations

For $R_{ds} > 0$ or $\lambda \neq 1$:

$$V_{dsat} = \frac{-b - \sqrt{b^2 - 4ac}}{2a}$$

$$a = A_{bulk}^2 W_{eff} V_{sat} C_{ox} R_{DS} + \left(\frac{1}{\lambda} - 1\right) A_{bulk}$$

$$b = -\left((V_{gsteff} + 2v_t)\left(\frac{2}{\lambda} - 1\right) + A_{bulk} E_{sat} L_{eff} + 3A_{bulk}(V_{gsteff} + 2v_t)W_{eff} v_{sat} C_{ox} R_{DS}\right)$$

$$c = (V_{gsteff} + 2v_t)E_{sat}L_{eff} + 2(V_{gsteff} + 2v_t)^2 W_{eff} v_{sat} C_{ox} R_{DS}$$

$$\lambda = A_1 V_{gsteff} + A_2$$

For Rds = 0 and $\lambda$ = 1:

$$V_{dsat} = \frac{E_{sat} L_{eff}(V_{gsteff} + 2v_t)}{A_{bulk} E_{sat} L_{eff} + (V_{gsteff} + 2v_t)}$$

$$A_{bulk} = \left(1 + \frac{K_{1ox}}{2\sqrt{\Phi_s - V_{bseff}}}\left(\frac{A_o L_{eff}}{L_{eff} + 2\sqrt{X_J X_{dep}}}\left(1 - A_{gs}V_{gsteff}\left(\frac{L_{eff}}{L_{eff} + 2\sqrt{X_J X_{dep}}}\right)^2\right) + \frac{B_o}{W'_{eff} + B_1}\right)\right)\frac{1}{1 + Keta V_{bseff}}$$

$$E_{sat} = \frac{2V_{sat}}{\mu_{eff}}$$

TABLE 8

Effective $V_{ds}$ Equations

$$V_{dseff} = V_{dsat} - \frac{1}{2}\left(V_{dsat} - V_{ds} - \delta + \sqrt{(V_{dsat} - V_{ds} - \delta)^2 + 4\delta V_{dsat}}\right)$$

TABLE 9

Drain Current Expression Equations

$$I_{ds} = \frac{I_{dso(Vdseff)}}{1 + \frac{R_{ds}I_{dso(Vdseff)}}{V_{dseff}}}\left(1 + \frac{V_{ds} - V_{dseff}}{V_A}\right)\left(1 + \frac{V_{ds} - V_{dseff}}{V_{ASCBE}}\right)$$

$$I_{dso} = \frac{W_{eff}\mu_{eff}C_{ox}V_{gseff}\left(1 - A_{bulk}\frac{V_{dseff}}{2(V_{gseff} + 2v_t)}\right)V_{dseff}}{L_{eff}[1 + V_{dseff}/(E_{sat}L_{eff})]}$$

$$V_A = V_{Asat} + \left(1 + \frac{P_{vag}V_{gsteff}}{E_{sat}L_{eff}}\right)\left(\frac{1}{V_{ACLM}} + \frac{1}{V_{ADIBLC}}\right)^{-1}$$

$$V_{ACLM} = \frac{A_{bulk}E_{sat}Leff + V_{gseff}}{P_{CLM}A_{bulk}E_{sat}litl}(V_{ds} - V_{dseff})$$

$$V_{ADIBLC} = \frac{(V_{gseff} + 2v_t)}{\theta_{rout}t(1 + P_{DIBLCB}V_{bseff})}\left(1 - \frac{A_{bulk}V_{dsat}}{A_{bulk}V_{dsat} + V_{gsteff} + 2v_t}\right)$$

TABLE 9-continued

Drain Current Expression Equations

$$\theta_{rout} = P_{DIBLC1}\left[\exp\left(-D_{ROUT}\frac{L_{eff}}{2l_{t0}}\right) + 2\exp\left(-D_{ROUT}\frac{L_{eff}}{lr0}\right)\right] + P_{DIBLC2}$$

$$\frac{1}{V_{ASCBE}} = \frac{P_{scbe2}}{L_{eff}}\exp\left(\frac{-P_{scbe1}litl}{V_{ds} - V_{dseff}}\right)$$

TABLE 9-continued

Drain Current Expression Equations $$V_{Asat} = \frac{E_{sat}L_{eff} + V_{dsat} + 2R_{DS}v_{sat}C_{ox}W_{eff}V_{gseff}\left[1 - \frac{A_{bulk}V_{dsat}}{2(V_{gsteff} + 2v_t)}\right]}{2/\lambda - 1 + R_{DS}v_{sat}C_{ox}W_{eff}A_{bulk}}$$

$$litl = \sqrt{\frac{\varepsilon_{si}T_{ox}X_j}{\varepsilon_{ox}}}$$

TABLE 10

Substrate Current Equations $$I_{sub} = \frac{\alpha_0 + \alpha_1 \cdot L_{eff}}{L_{eff}}(V_{ds} - V_{dseff})\exp\left(-\frac{\beta_0}{V_{ds} - V_{dseff}}\right)\frac{I_{ds0}}{1 + \frac{R_{ds}I_{ds0}}{V_{dseff}}}\left(1 + \frac{V_{ds} - V_{dseff}}{V_A}\right)$$

TABLE 11

Polysilicon Depletion Effect Equations $$V_{poly} = \frac{1}{2}X_{poly}E_{poly} = \frac{qN_{gate}X_{poly}^2}{2\varepsilon_{si}}$$

$$\varepsilon_{ox}E_{ox} = \varepsilon_{si}E_{poly} = \sqrt{2q\varepsilon_{si}N_{gate}V_{poly}}$$

$$V_{gs} - V_{FB} - \Phi_s = V_{poly} + V_{ox}$$

$$a(V_{gs} - V_{FB} - \Phi_s - V_{poly})^2 - V_{poly} = 0$$

$$a = \frac{\varepsilon_{ox}^2}{2q\varepsilon_{si}N_{gate}T_{ox}^2}$$

$$V_{gs\_eff} = V_{FB} + \Phi_s + \frac{q\varepsilon_{si}N_{gate}T_{ox}^2}{\varepsilon_{ox}^2}\left(\sqrt{1 + \frac{2\varepsilon_{ox}^2(V_{gs} - V_{FB} - \Phi_s)}{q\varepsilon_{si}N_{gate}T_{ox}^2}} - 1\right)$$

TABLE 12

Effective Channel Length and Width Equations $$L_{eff} = L_{drawn} - 2dL$$
$$W_{eff} = W_{drawn} - 2dW$$
$$W_{eff}' = W_{drawn}2dW'$$

$$dW = dW' + dW_gV_{gsteff} + dW_b\left(\sqrt{\Phi_s - V_{bseff}} - \sqrt{\Phi_s}\right)$$

$$dW' = W_{int} + \frac{W_l}{L^{Wln}} + \frac{W_w}{W^{Wwn}} + \frac{W_{wl}}{L^{Wln}W^{Wwn}}$$

$$dL = L_{int} + \frac{L_l}{L^{Lln}} + \frac{L_w}{W^{Lwn}} + \frac{L_{wl}}{L^{Lln}W^{Lwn}}$$

TABLE 13

Source/Drain Resistance Equations $$R_{ds} = \frac{R_{dsw}\left(1 + P_{rwg}V_{gsteff} + P_{rwb}\left(\sqrt{\Phi_s - V_{bseff}} - \sqrt{\Phi_s}\right)\right)}{(10^6 W_{eff}')^{W_r}}$$

TABLE 14

Temperature Effect Equations $V_{th(T)}\ V_{th(Tnorm)}\ K_T\ K_{t1}\ L_{eff}\ D_T\ V_{bseff}\ T\ T_{norm}$ $$R_{dsw(T)} = R_{dsw(Tnorm)} + P_{rt}\left(\frac{T}{T_{norm}} - 1\right)$$

$$U_{a(T)} = U_{a(Tnorm)} + U_{a1}(T/T_{norm} - 1)$$
$$U_{b(T)} = U_{b(Tnorm)} + U_{b1}(T/T_{norm} - 1)$$
$$U_{c(T)} = U_{c(Tnorm)} + U_{c1}(T/T_{norm}\ 0\ 1)$$

Symbols and parameters for the aforementioned equations not previously defined are defined in Table 15:

TABLE 15

| Parameter Symbol | Definition |
| --- | --- |
| $\alpha_1$ | Alpha1. Isob parameter for length scaling |
| $\alpha_o$ | Alpha0. The first parameter if impact ionization current |
| Vth0ox = | Vth0-$k_1 \sqrt{\Phi_s}$ |
| $\delta$ | delta Effective Vds parameter |
| $\beta o$ | beta0 The second parameters of impact ionization current |
| $\Phi_s$ | Surface potential |
| $\theta_{th}(L)$ | Short channel effect coefficient |
| $A_{bulk}$ | Bulk charge effect |
| $C_{it}$ | Capacitance due to interference states |
| $C_{it}$ | Interface trap capacitance |
| $C_{ox}$ | Gate capacitance per unit area |
| $E_{ox}$ | Electrical field in the gate oxide |
| $E_{eff}$ | Average electrical field experienced by the carrier in the inversion layer |
| $E_{poly}$ | Max electrical field in the poly gate |
| $E_{sat}$ | Critical electrical field at which the carrier velocity becomes saturated |
| $I_{ds}$ | Total drain current |
| $I_{dso}$ | Current is saturation region |
| $I_{sus}$ | Substrate current |
| $L_1$ | Coefficient of length dependence for length offset |
| $L_{drawn}$ | Mash level channel length |
| $L_{eff}$ | Channel length |
| $L_{ln}$ | Power of length dependence for length offset |
| $l_t$ | Characteristic length |
| $L_w$ | Coefficient of width dependence for length offset |
| $L_{wl}$ | Coefficient of length and width cross term for length offset |

TABLE 15-continued

| Parameter Symbol | Definition |
| --- | --- |
| $M_{eff}$ | Unified formulation of mobility |
| $N_{adibil}$ | Early voltage due to drain induced barrier lowering effect |
| $N_{ch}$ | Doping Concentration in Channel |
| Nd | Source/drain doping concentration |
| $N_{gate}$ | Doping concentration in the n+ poly-silicon |
| $N_{sub}$ | Doping concentration in substrate |
| $P_{rwb}$ | Body bias coefficient |
| Prwg | Gate bias coefficient |
| $P_{scbe2}$ | Second substrate current body effect parameter |
| $R_{ds}$ | Parasitic resistance |
| $R_{dsw}$ | Resistance per unit width |
| $T_{axm}$ | Gate oxide thickness at which parameters are extracted with a default value of Tox |
| $T_{norm}$ | Temperance at which parameters are extracted |
| $T_{ox}$ | Gate Oxide Thickness |
| $T_{oxm}$ | Tox at which parameters are extracted |
| $V_a$ | Total early voltage |
| $V_{aclm}$ | Early voltage due to channel length modulation |
| $V_{asat}$ | Early voltage at Vds = Vdsat |
| $V_{ASCBE}$ | Early voltage due to the substrate current induced body effect |
| $V_{bc}$ | Maximum allowable Vbs value |
| $V_{bi}$ | Built in voltage of the junction between the source and the substrate |
| $V_{bseff} = V_{bs}$ | Upper bound for body bias during simulations |
| $V_{dsat}$ | Saturation voltage |
| $V_{eff}$ | Effect voltage |
| $V_{fb}$ | DC flat band voltage |
| $V_{gsteff}$ | Effective gate voltage |
| $V_{gsteff}$ | Effective gate voltage - threshold voltage |
| $V_{ox}$ | Voltage drop across gate oxide |
| $V_{poly}$ | Voltage drop in poly gate |
| $V_t$ | Thermal Voltage |
| $V_{th}$ | Threshold Voltage |
| W | Device channel width (Vgs-Vth) |
| $W_{drawn}$ | Mash level channel width |
| $W_{eff}$ | Effective channel width |
| $W_{ln}$ | Power of length dependence of width offset |
| $W_r$ | Fitting parameter |
| $W_{wl}$ | Coefficient of length and width offset |
| $W_{wn}$ | Power of width dependence of width offset |
| $X_d$ | Depletion width in substrate |
| $X_{dep}$ | Depletion width in the substrate |
| $X_{dep}$ | Depletion width in the substrate |
| $X_{dep/n}$ | Average depletion width along the channel |
| $X_j$ | Junction depth |
| $X_p$ | Depletion width in polygate |
| Y | Body bias coefficient |

Figure 6:
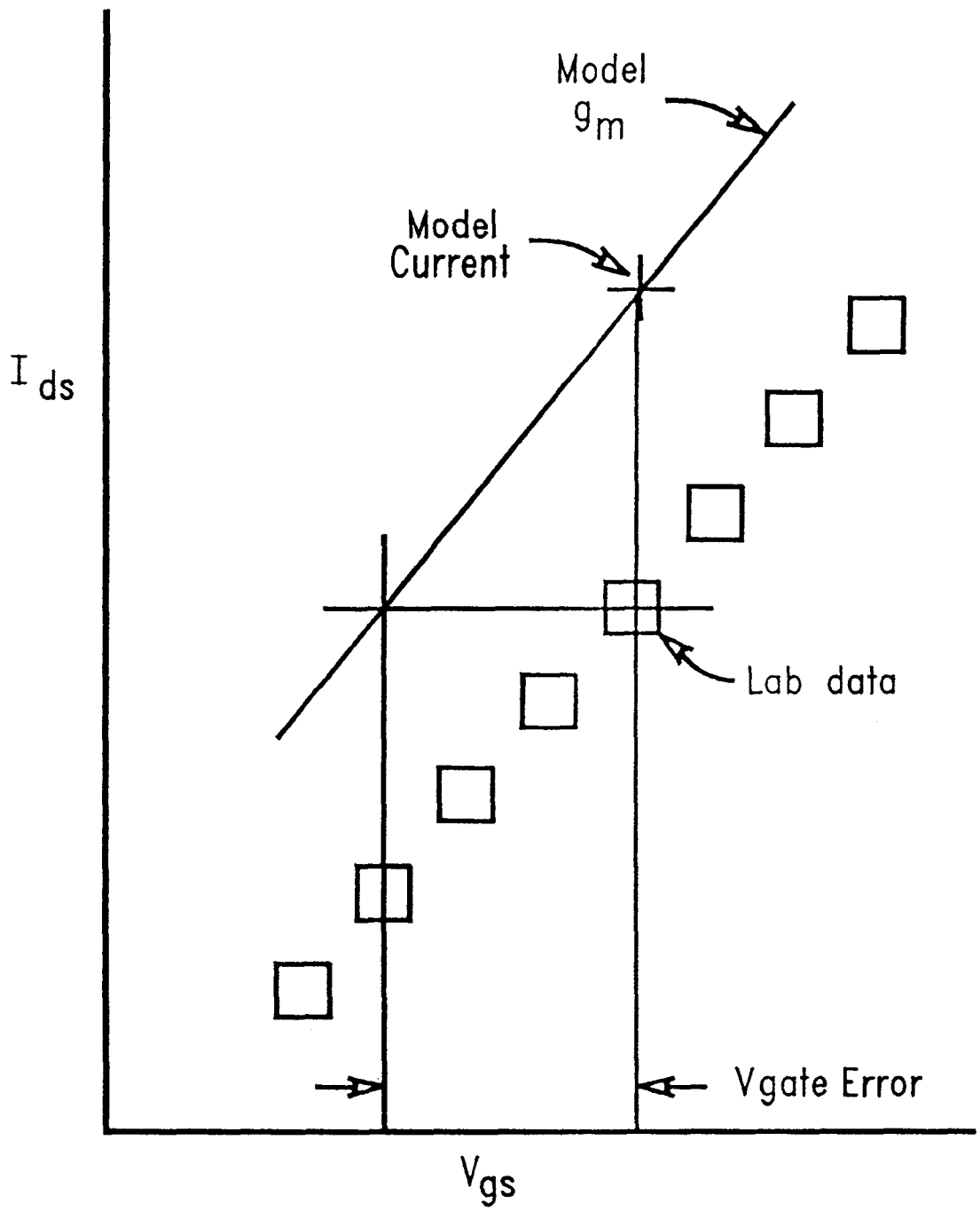
FIG. 6 is a plot showing calculation of voltage error from current error between measured and calculated current versus voltage values.

The individual data points of the drain current versus gate voltage plot and drain current versus drain voltage plot resulting from the aforementioned equations were compared to the drain current versus gate voltage plot and drain current versus drain voltage plot from the test measurements of FIGS. 3a, 3b and 4. A plot showing the voltage error is shown in FIG. 6. The difference in current at each data point, if any, was converted into a voltage error by dividing the current difference by the gradient of current/voltage from the BSIM3 equations of Tables 4–14. Conversion of the current errors into voltage errors enables large device-to-device current differences to be brought into the same voltage scale.

A voltage error is assigned to each point in the drain current versus gate voltage sweeps (FIGS. 3a and b) and drain current versus drain voltage sweeps (FIG. 4). The sum of each of these numbers was one component of the total fitness. The voltage error was defined at the magnitude of the vector of voltage shifts ($\Delta$Vgs, $\Delta$Vds, $\Delta$Vbs) that would have had to have been added to the vector of actual voltages (Vgs, Vds, Vbs) for the model to predict the measured current. If the model and predicted current exactly matched, this value was zero. For computing the fitness function, the voltage error was estimated as:

$$\frac{Ids(lab) - Ids(model)}{\sqrt{gm^2(model) + gds^2(model) + gmbs^2(model)}}$$

In the subthreshold region, this equation was modified to take into account the exponential nature of the drain current-gate voltage relationship by using log(Ids(lab)/IDS(model)) in place of the current difference.

The lab self gain was fit to a power series expansion in drain current using powers from −5 to +1. The self gain and corresponding drain currents were calculated using BSIM3 equations for voltages selected to provide currents close to the lab values. These drain currents were used with the same power series coefficients to estimate the lab self gain at the same drain current. The estimated lab self gain was compared to the model self gain. Because most compact models for circuit simulation such as the BSIM3 model do not include calculation of second derivatives of current with respect to voltages, additional model runs were made to estimate second derivative of drain current with respect to both Vdrain and Vgate. The voltage error was then estimated in a fashion analogous the voltage error for the drain current versus gate voltage and drain current versus drain voltage sweeps and the sum of these errors was calculated.

The drain conductance (dId/dVds) and transconductance (dId/dVgs) from the model was found for an array of voltage conditions beyond the physical limitations of the device but within a range that might be encountered by the model during circuit simulation. A penalty was added to the score for each of these points at which the transconductance (gate or body) was negative. The penalty was calculated as a linearly decreasing function of Vgate such that it became zero at the highest gate voltage simulated. The quantities gm and gmbs were calculated for Vgs=0 to 20 in 2 volt steps. For each negative gm found, the penalty was calculated as follows:

Penalty=0.01*(20−Vgs)−0.1*(20−Vgs)*gm

For each negative gmbs found, the penalty was calculated as follows:

Penalty=0.01*(20−Vgs)−0.1*(20−Vgs)*gmbs

All the penalties were summed to obtain the total penalty for negative transconductances.

The threshold voltage and the quantity (Idsat/(Weff/Leff) were calculated for four MOSFET channel length/width combinations, where Idsat is the drain current at Vgate=Vdrain=Vdd, Vsource=Vsubstrate=0, Weff is the effective channel width, and Leff is the effective channel length. These combinations represent all combinations i) just large enough to be free of short/narrow channel effects and ii) less than 1000 micrometers. For present technology, the minimum length or width of the channel is 2 microns, so the channel length/width combinations would be 2 $\mu$m×2 $\mu$m, 2 $\mu$m×1000 $\mu$m, 1000 $\mu$m×2 $\mu$m, 1000 $\mu$m×1000 $\mu$m. A penalty was added if these two parameters were not the same within specified tolerances at all of the geometries simulated. This penalty is proportional to the magnitude of the difference, and was calculated as follows. Vt and the specific drain current for the aforementioned voltage points were calculated, and then the average of each was calculated (Vt ave and Id ave). For each voltage point, if the absolute value of (Vt ave−Vt) is greater than 0.005, then:

Penalty=abs(Vt ave−Vt)−0.005

For each voltage point, if the absolute value of ((Id ave−Id)/Id) is greater than 0.01, then:

Penalty=abs((Id ave−Id)/Id)−0.01

The total penalty was calculated as follows:

Total Penalty=sum of penalties*100

The fitness of each individual was determined by summing for all data points the two calculated voltage errors and two penalties and then evaluating the fitness value for each vector.

Select Most Fit Individuals and Apply Genetic Operators

The most fit individuals, i.e., those having the lowest fitness values, were then selected to create a subset of vectors and operations of mutation and crossover are applied to create a new population. U.S. Pat. No. 5,136,686, incorporated herein by reference, teaches the application of the genetic operators of mutation and crossover.

Mutation is the process of creating a new individual from a single existing individual by randomly selecting one or more of the real numbers in that individual and randomly changing its value. Crossover creates new individuals by combining randomly selected portions of two or more individuals into a single individual. Both mutation and crossover are described in the aforementioned U.S. Pat. No. 5,136,686, the disclosure of which is hereby incorporated by reference, particularly at column 11, lines 41–50 and column 20, beginning at line 5.

Test Population Diversity

The diversity or convergence velocity of the population was tested by comparing them against each other. The formula used was Simpson's Index, which is well known. Simpson's Index (SI) is a measure of the diversity of a population, and is defined as the summation from one to the number of species in a population, of the quantity of that species (as a percent of the total population) squared. For the present invention, this is calculated by using groups of individuals of with the same fitness value (rounded to an integer) in place of species. A totally non-diverse population (all members of the population of the same species) has an SI of 1.0, and as the SI approaches 0 the population becomes more and more diverse.

If the diversity was too high, the steps of calculating the selected subset of parameters, evaluating fitness, selecting the most fit individuals and applying genetic operators were repeated until an "almost acceptable" model was reached, i.e., until improvement essentially stops. At this point, continuing with valuable computer time yields diminishing returns, even with the genetic algorithm approach of the present invention. The process was then continued on to the next step.

Add Meta Evolution Parameters

To speed the process towards the end goal of an acceptable model fit, the approach was modified from a genetic algorithm (GA) approach to one based on evolutionary strategies (ES), which are well known in other fields. For each vector in the population, one or more vectors of meta evolutionary parameters were assigned to control the genetic operators. This permits the evolution of each parameter of each vector to be controlled much more precisely and in a highly independent fashion when compared to the GA evolution process. Furthermore, the meta evolutionary were permitted to evolve. Although the initial portion of the search algorithm described previously was fairly broad, by this point in the process some of the parameters were essentially fixed. Adding to the meta evolutionary parameters permitted the well-fixed parameters to remain fixed and wile allowing other parameters of a vector to evolve further. This resulted in much faster convergence to an acceptable model.

Apply Genetic Operators

A new parent population of vectors was created by applying the genetic operation of mutation and/or crossover to create a new generation, as described above.

Calculate Selected Subset of Parameters

For each individual vector, a small group of key parameters was calculated deterministically as described previously from the vector of stochastically assigned parameters in such a way that the fit to the data is optimized.

Evaluate By Fitness Function

The fitness of each vector was then evaluated by the method described previously.

Select Most Fit Individuals

The value of the fitness function was then tested as described previously and, if not sufficient, the application of genetic operations to create a new population, calculation of key parameters and fitness evaluation are optionally repeated until acceptable final model parameters are obtained.

A comparison using the same data was made between UTMOST, a commercial MOSFET fitting program sold by Silvaco Data Systems, and the genetic algorithm of the present invention. Twelve different geometries were fitted and the results of the comparison are shown in Table 16. The shortest device had Leff=0.14 micrometers.

Table 16 shows in the Fails/Points column the number of individual data points failing the error criteria for the three regions of MOSFET operation. The other columns show the Mean Error and standard deviation of the errors (STD of Error) of individual points for the respective regions. In each case the present invention has smaller standard deviation of errors indicating a better fit.

The UTMOST fit required approximately two weeks of full time work by an experienced engineer using the UTMOST tool. The stochastic genetic algorithm of the present invention required about 15 hours of computer time on an RS6000 work station with no operator interaction after the job was started. When fully implemented, it is estimated that the system of the present invention will increase the efficiency of a logic development modeling group while providing better quality fits.

As can be seen, the present invention achieves the aforementioned objects and provides a number of innovations and advantages over the prior art. It provides a method of calculating certain critical parameters deterministically to limit the size of the search space. Additionally, the present invention provides a fitness function which may accommodate semiconductor devices in which the model output varies by many order of magnitude. The fitness function of the present invention overcomes this problem by summing the range space errors divided by the largest partial derivative of the relevant output with respect to the model inputs. The fitness function also includes a measure of the physical reasonableness of the model in regions where actual data cannot be measured because the device will not operate there. These constraints are important for models which will be used in complex computer simulations because violating them can lead to failure of the simulations to converge.

Finally, the stochastic algorithm of the present invention includes two search loops, one with a relatively large constant mutation operation to ensure a complete search of the solution space and a second with a co-evolving mutation operation to provide efficient convergence. The invention includes a test to switch from the first search loop to the second search loop when the first search has adequately explored the large scale variations in the problem space.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

What is claimed is:

1. A method of determining a set of parameters for modeling an active semiconductor device in which current flow through a channel or other area is regulated by voltage applied to the device terminals comprising the steps of:
    a) measuring a plurality of values for current as a function of voltage for a plurality of active semiconductor devices of differing geometries;
    b) determining an initial population of vectors comprising individual values representing a plurality of desired active semiconductor device model parameters;
    c) evacuating fitness for each of said vectors by:
        i) comparing calculated values for current as a function of voltage from said population to the plurality of measured values for current as a function of voltage of said vectors,
        ii) converting any current differences to voltage errors and
        iii) adding any such voltage errors together to arrive at a fitness value for each vector;
    d) selecting vectors of best fitness and applying at least one genetic operator thereto to create a new population of said vectors;
    e) adding meta evolution parameters to each vector from the new population of said vectors having a sufficiently low population of diversity to control genetic operators and permit the rate and direction of change to evolve with each vector from generation to generation;
    f) selecting vectors of best fitness and applying at least one genetic operator to the vectors having added meta evolution parameters to create a new population of said vectors; and
    g) selecting vectors of best fitness and optionally repeating steps (c) through (f) for such vectors of best fitness until a desired fitness is achieved to determine said desired active semiconductor device model parameters.

2. The method of claim 1 wherein the measured values for current as a function of voltage for a plurality of active semiconductor devices comprise values for drain current as a function of gate voltage, drain current as a function of drain voltage, and self gain.

3. The method of claim 1 wherein step (a) comprises measuring a plurality of values for current as a function of voltage for a plurality of MOSFETs of differing geometries.

4. A method of determining fitness of a vector comprising a set of parameters for modeling an active semiconductor device in which current flow through a channel or other area is regulated by voltage applied to the device terminals, said set of parameters of said vectors including added meta evolution parameters for controlling genetic operators and permitting the rate and direction of change to evolve with each vector from generation to generation, comprising the steps of:
    a) measuring a plurality of values for current as a function of voltage for a plurality of active semiconductor devices of differing geometries, the measured values for current as a function of voltage for a plurality of active semiconductor devices comprising values for drain current as a function of gate voltage, drain current as a function of drain voltage, and self gain;
    b) assigning an error to each current value calculated from said vector which differs from the measured values of drain current as a function of gate voltage and drain current as a function of drain voltage by converting any current differences to voltage errors;
    c) assigning an error to each self gain value calculated from said vectors which differs from the measured values of self gain by converting any self gain differences to voltage errors;
    d) assigning a penalty based on drain conductance and transconductance model parameters;
    e) assigning a penalty based or threshold voltage calculated from model parameters for a plurality of active semiconductor device channel width and length combinations; and
    f) combining said errors and penalties to determine fitness for said vector having said added meta evolution parameters.

5. The method of claim 4 wherein step (a) comprises measuring a plurality of values for current as a function of voltage for a plurality of MOSFETs of differing geometries.

6. A method of determining a set of parameters for modeling an active semiconductor device in which current flow through a channel or other area is regulated by voltage applied to the device terminals comprising the steps of:
    a) measuring a plurality of values for current as a function of voltage for a plurality of active semiconductor devices of differing geometries;
    b) determining an initial population of vectors comprising individual values representing a plurality of desired active semiconductor device model parameters;
    c) calculating values for a subset of parameters comprising fewer than all of said desired model parameters from each of said vectors;
    d) evaluating fitness for each of said vectors by comparing vector individual values to the measured values using a fitness function;
    e) selecting vectors of best fitness and applying at least one genetic operator thereto to create a new population of said vectors;
    f) testing diversity of said population of vectors and optionally repeating steps (c) through (e) until a sufficiently low vector population diversity is achieved;
    g) adding meta evolution parameters to each vector from the vectors having sufficiently low population diversity of step (f) to control genetic operators and permit the rate and direction of change to evolve with each vector from generation to generation;
    h) applying at least one genetic operator to the vectors having added meta evolution parameters to create a new population of said vectors;
    i) calculating values for said subset of parameters from each of said new population of vectors created in step (h);

j) evaluating fitness for each of said vectors by comparing vector individual values to the measured values using a fitness function; and k) selecting vectors of best fitness and optionally repeating steps (h) through (j) for such vectors of best fitness until a desired fitness is achieved to determine said desired active semiconductor device model parameters.

7. The method of claim 6 wherein the measured values for current as a function of voltage for a plurality of active semiconductor devices comprise values for drain current as a function of gate voltage, drain current as a function of drain voltage, and self gain.

8. The method of claim 6 wherein said subset of parameters is selected from the group consisting of threshold voltage, mobility factor, subthreshold swing factor and offset voltage in the subthreshold region.

9. The method of claim 6 wherein in step (c) calculating said values for a subset of parameters from each of said vectors is by applying a Newton-Raphson algorithm.

10. The method of claim 6 wherein in step (d) using said fitness function comprises assigning an error to calculated values for current as a function of voltage from said population as compared to the plurality of measured values for current as a function of voltage of said vectors by converting any current differences to voltage errors and adding any such voltage errors together.

11. The method of claim 6 wherein the measured values for current as a function of voltage for a plurality of active semiconductor devices comprise values for drain current as a function of gate voltage, drain current as a function of drain voltage, and self gain, and wherein in step (d) using said fitness function comprises the steps of:

i) assigning an error to each current value calculated from said vectors which differs from the measured values of drain current as a function of gate voltage and drain current as a function of drain voltage by converting any current differences to voltage errors;

ii) assigning an error to each self gain value calculated from said vectors which differs from the measured values of self gain by converting any self gain differences to voltage errors;

iii) assigning a penalty based on drain conductance and transconductance model parameters;

iv) assigning a penalty based on threshold voltage calculated from model parameters for a plurality of active semiconductor device channel width and length combinations; and v) combining said errors and penalties to determine fitness for each of said vectors.

12. The method of claim 6 wherein in step (e) genetic operators of crossover and mutation are applied to the selected individuals of best fitness.

13. The method of claim 6 wherein in step (h) said genetic operator is selected from the group consisting of crossover and mutation.

14. The method of claim 6 wherein steps (c) through (e) are repeated until a sufficiently low vector population diversity is achieved and wherein steps (h) through (j) are repeated until a desired fitness is achieved to determine said desired active semiconductor device model parameters.

15. The method of claim 6 wherein step (a) comprises measuring a plurality of values for current as a function of voltage for a plurality of MOSFETs of differing geometries.

16. A program storage device readable by a machine, tangibly embodying a database for containing i) a plurality of measured values for current as a function of voltage for a plurality of active semiconductor devices of differing geometries in which current flow through a channel or other area is regulated by voltage applied to the device terminals and ii) an initial population of vectors comprising individual values representing a plurality of desired active semiconductor device model parameters, said device further having a program of instructions executable by the machine to perform a method of determining a set of parameters for modeling an active semiconductor device, said method comprising the steps of:

a) evaluating fitness for each of said vectors by:
   i) comparing calculated values for current as a function of voltage from said population to said plurality of measured values for current as a function of voltage of said vectors,
   ii) converting any current differences to voltage errors, and
   iii) adding any such voltage errors together to arrive at a fitness value for each vector;

b) selecting vectors of best fitness and applying at least one genetic operator thereto to create a new population of said vectors;

c) adding meta evolution parameters to each vector from the new population of said vectors having a sufficiently low population of diversity to control genetic operators and permit the rate and direction of change to evolve with each vector from generation to generation;

d) selecting vectors of best fitness and applying at least one genetic operator to the vectors having added meta evolution parameters to create a new population of said vectors; and e) selecting vectors of best fitness and optionally repeating steps (a) through (d) for such vectors of best fitness until a desired fitness is achieved to determine said desired active semiconductor device model parameters.

17. A program storage device readable by a machine, tangibly embodying a database for containing i) a plurality of measured values for current as a function of voltage for a plurality of active semiconductor devices of differing geometries in which current flow through a channel or other area is regulated by voltage applied to the device terminals and ii) an initial population of vectors comprising individual values representing a plurality of desired active semiconductor device model parameters, said device further having a program of instructions executable by the machine to perform a method of determining a set of parameters for modeling an active semiconductor device, said method comprising the steps of:

a) calculating values for a subset of parameters comprising fewer than all of said desired model parameters from each of said vectors;

b) evaluating fitness for each of said vectors by comparing vector individual values to said measured values using a fitness function;

c) selecting vectors of best fitness and applying at least one genetic operator thereto to create a new population of said vectors;

d) testing diversity of said population of vectors and optionally repeating steps (a) through (c) until a sufficiently low vector population diversity is achieved;

e) adding meta evolution parameters to each vector from the vectors having sufficiently low population diversity of step (d) to control genetic operators and permit the rate and direction of change to evolve with each vector from generation to generation;

f) applying at least one genetic operator to the vectors having added meta evolution parameters to create a new population of said vectors;

g) calculating values for said subset of parameters from each of said new population of vectors created in step (f);

h) evaluating fitness for each of said vectors by comparing vector individual values to said measured values using a fitness function; and i) selecting vectors of best fitness and optionally repeating steps (f) through (h) for such vectors of best fitness until a desired fitness is achieved to determine said desired active semiconductor device model parameters.

18. The program storage device of claim 17 wherein said subset of parameters is selected from the group consisting of threshold voltage, mobility factor, subthreshold swing factor and offset voltage in the subthreshold region.

19. The program storage device of claim 17 wherein in step (a) calculating said values for a subset of parameters from each of said vectors is by applying a Newton-Raphson algorithm.

20. The program storage device of claim 17 wherein in step (b) using said fitness function comprises assigning an error to calculated values for current as a function of voltage from said population as compared to said plurality of measured values for current as a function of voltage of said vectors by converting any current differences to voltage errors and adding any such voltage errors together.

21. A program storage device readable by a machine, tangibly embodying a database for containing a plurality of measured values for current as a function of voltage for a plurality of active semiconductor devices of differing geometries, said measured values for current as a function of voltage for a plurality of active semiconductor devices comprising values for drain current as a function of gate voltage, drain current as a function of drain voltage, and self gain, said device further having a program of instructions executable by the machine to for modeling an active semiconductor device in which current flow through a channel or other area is regulated by voltage applied to the device terminals, said set of parameters of said vectors including added meta evolution parameters for controlling genetic operators and permitting the rate and direction of change to evolve with each vector from generation to generation, said method comprising the steps of:

a) assigning an error to each current value calculated from said vector which differs from the measured values of drain current as a function of gate voltage and drain current as a function of drain voltage by converting any current differences to voltage errors;

b) assigning an error to each self gain value calculated from said vectors which differs from the measured values of self gain by converting any self gain differences to voltage errors;

c) assigning a penalty based on drain conductance and transconductance model parameters;

d) assigning a penalty based on threshold voltage calculated from model parameters for a plurality of active semiconductor device channel width and length combinations; and e) combining said errors and penalties to determine fitness for said vector having said added meta evolution parameters.

* * * * *

UNITED STATES PATENT AND TRADEMARK OFFICE
CERTIFICATE OF CORRECTION

PATENT NO.   : 6,314,390 B1
DATED        : November 6, 2001
INVENTOR(S)  : Bittner et al.

It is certified that error appears in the above-identified patent and that said Letters Patent is hereby corrected as shown below:

Column 2,
Line 64, delete "prepared" and substitute therefore -- repeated --

Column 11,
Table 1, line beginning "ngate" delete "1e16-6e21" and substitute therefore -- 1e18-6e21 --
Table 1, line beginning "ljnt" delete "ljnt" and substitute therefore -- lint --.

Column 12,
Table 2, line beginning "u0" delete "Mobility at temp = Tnormal" and substitute therefore -- Mobility at temp = Tnominal --.

Columns 13-14,
Table 4, line beginning "$V_{th}$...." delete section of equation beginning
"$+ (K_3 + K_{3b}V_{bseff})\dfrac{T_{ox}}{W'_{eff} + W_0} \Phi_s$" and substitute therefore -- $+ (K_3 + K_{3b}V_{bseff})\dfrac{T_{ox}}{W_{eff}' + W_0} \Phi_s$ --.

Table 4, line beginning "(exp(-$D_{sub}$ ...))" delete section of equation beginning
"$(E_{too} + E_{lab}V_{bseff})V_{ds}$" and substitute therefore -- $(E_{tao} + E_{tab}V_{bseff})V_{ds}$ --.

Columns 15-16,
Table 4, line beginning "$V_{bseff}$..." delete section of equation beginning "$(\delta 1=0.001)$" and substitute therefore -- $(\delta 1=0.001)$ --.
Table 4, line beginning "$V_{bc}$= ..." delete section of equations beginning "$\left(\Phi_s - \dfrac{K_1^2}{4K_2^2}\right)$" and substitute therefore -- $\left(\Phi_s - \dfrac{K_1^2}{4K_2^2}\right)$ --.

Table 5, line beginning "n = 1 + N..." delete section of equation above the line as follows:
"$(C_{dsc} + C_{dscd}V_{th} + C_{dscb}V_{bseff})$" and substitute therefore -- $(C_{dsc} + C_{dscd}V_{ds} + C_{dscb}V_{bseff})$ --.

Column 17,
Table 6, line beginning "$\mu_{eff}$ ..." delete section of equation below line as follows:
"$1 + (U_a + U_cV_{bseff})\left(\dfrac{V_{gsteff}}{Tox}\right) + U_b\left(\dfrac{V_{gsteff}}{Tox}\right)^2$"

and substitute therefore -- $1 + (U_a + U_cV_{bseff})\left(\dfrac{V_{gsteff}}{Tox}\right) + U_b\left(\dfrac{V_{gsteff}}{Tox}\right)^2$ --

UNITED STATES PATENT AND TRADEMARK OFFICE
CERTIFICATE OF CORRECTION

PATENT NO. : 6,314,390 B1
DATED : November 6, 2001
INVENTOR(S) : Bittner et al.

It is certified that error appears in the above-identified patent and that said Letters Patent is hereby corrected as shown below:

Column 17 (con't),
Table 7, line beginning "a = $A_{bulk}^2 W_{eff}$...." delete section of equation below as follows " $a = A^2{}_{bulk} W_{eff} V_{sat} C_{ox} R_{DS} + \left(\frac{1}{\lambda} - 1\right) A_{bulk}$ "

and substitute therefore -- $a = A_{bulk}{}^2 W_{eff} V_{sat} C_{ox} R_{DS} + \left(\frac{1}{\lambda} - 1\right) A_{bulk}$ --

Column 20,
Table 14, line beginning "$V_{th(T)}$..." delete "$D_T$" and substitute therefore -- $K_T$ --.

Column 21,
Table 15, line beginning first instance "Vgsteff" delete "$V_{gsteff}$" and substitute therefore -- $V_{gs\text{-}eff}$ --.

Column 25,
Line 29, delete "evacuating" and substitute therefore -- evaluating --.

Column 30,
Line 5, after "to" insert therefore -- perform a method of determining fitness of a vector comprising a set of parameters --.

Signed and Sealed this

Twenty-ninth Day of October, 2002

Attest:

JAMES E. ROGAN
Attesting Officer
Director of the United States Patent and Trademark Office